(12) United States Patent
Park

(10) Patent No.: US 9,326,382 B2
(45) Date of Patent: Apr. 26, 2016

(54) BENT PRINTED CIRCUIT BOARD FOR BACKLIGHT UNIT

(71) Applicant: LG INNOTEK CO., LTD., Seoul (KR)

(72) Inventor: Hyun Gyu Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/358,301

(22) PCT Filed: Nov. 15, 2012

(86) PCT No.: PCT/KR2012/009658
§ 371 (c)(1),
(2) Date: May 15, 2014

(87) PCT Pub. No.: WO2013/073861
PCT Pub. Date: May 23, 2013

(65) Prior Publication Data
US 2014/0311777 A1    Oct. 23, 2014

(30) Foreign Application Priority Data

Nov. 16, 2011    (KR) .......................... 10-2011-0119555

(51) Int. Cl.
*H05K 1/03* (2006.01)
*H05K 1/11* (2006.01)
(Continued)

(52) U.S. Cl.
CPC .......... *H05K 1/115* (2013.01); *G02F 1/133608* (2013.01); *H05K 1/0284* (2013.01); *H05K 1/118* (2013.01); *G02F 1/1336* (2013.01);
(Continued)

(58) Field of Classification Search
CPC ............. H05K 1/00; H05K 1/02; H05K 1/05; H05K 1/14; H05K 1/16; H05K 5/00; H05K 7/20; H01L 23/02; H01L 23/12; H01L 23/14; H01L 23/16; H01L 23/552; H01L 33/64; B05D 5/12
USPC ......... 174/255, 250, 251, 254, 259, 260, 527, 174/546; 361/706, 720, 748, 751, 752, 756, 361/793, 796; 257/99, 658, 678, 687, 699, 257/729, 787; 428/192, 209, 210, 901
See application file for complete search history.

(56) References Cited

U.S. PATENT DOCUMENTS 3,755,717 A * 8/1973 Shaw ............................ 361/751
4,530,557 A * 7/1985 Katsube et al. ............... 439/325
4,671,984 A * 6/1987 Maeda et al. .................. 428/209
(Continued)

FOREIGN PATENT DOCUMENTS

KR    10-2004-0008833 A    1/2004
KR    10-2006-0123597 A    12/2006
(Continued)

OTHER PUBLICATIONS

International Search Report in International Application No. PCT/KR2012/009658, filed Nov. 15, 2012.

*Primary Examiner* — Xiaoliang Chen
(74) *Attorney, Agent, or Firm* — Saliwanchik, Lloyd & Eisenschenk

(57) ABSTRACT

Provided is a bent printed circuit board for a backlight unit, including: a metal plate including a first part, a second part extending from the first part, and a bending part formed between the first part and the second part; an insulating layer on the metal plate; and through holes passing through at least one of the metal plate and the insulating layer and placed on the bending part.

11 Claims, 4 Drawing Sheets

(51) Int. Cl.
*H05K 1/02* (2006.01)
*G02F 1/1335* (2006.01)

(52) U.S. Cl.
CPC .... *H05K1/0278* (2013.01); *H05K 2201/09036* (2013.01); *H05K 2201/10106* (2013.01)

(56) References Cited

U.S. PATENT DOCUMENTS

| | | | | |
|---|---|---|---|---|
| 4,677,252 | A * | 6/1987 | Takahashi et al. | 174/254 |
| 4,764,413 | A * | 8/1988 | Nukii et al. | 428/192 |
| 5,208,734 | A * | 5/1993 | Someno | 361/706 |
| 5,316,831 | A * | 5/1994 | Nakajima et al. | 428/209 |
| 5,352,925 | A * | 10/1994 | Sudoh et al. | 257/659 |
| 5,633,069 | A * | 5/1997 | Shimizu et al. | 428/192 |
| 5,639,990 | A * | 6/1997 | Nishihara et al. | 174/527 |
| 5,672,414 | A * | 9/1997 | Okamoto et al. | 428/209 |
| 5,923,620 | A * | 7/1999 | Takenaka | 368/88 |
| 5,990,553 | A * | 11/1999 | Morita et al. | 257/729 |
| 5,998,738 | A * | 12/1999 | Li et al. | 174/250 |
| 6,025,555 | A * | 2/2000 | Mori et al. | 136/251 |
| 6,060,150 | A * | 5/2000 | Nakatani et al. | 428/209 |
| 7,348,492 | B1 * | 3/2008 | Kawai et al. | 174/254 |
| 8,464,570 | B2 * | 6/2013 | Cui | 72/379.2 |
| 2001/0032835 | A1 * | 10/2001 | Murooka et al. | 219/216 |
| 2002/0173202 | A1 * | 11/2002 | Okamoto | 439/607 |
| 2004/0124003 | A1 * | 7/2004 | Ryu et al. | 174/254 |
| 2005/0124186 | A1 * | 6/2005 | Young et al. | 439/71 |
| 2006/0049130 | A1 * | 3/2006 | Watanabe | 216/13 |
| 2006/0049495 | A1 * | 3/2006 | Hazeyama et al. | 257/678 |
| 2006/0244177 | A1 * | 11/2006 | Kaneto et al. | 264/248 |
| 2007/0125601 | A1 * | 6/2007 | Lutze | 182/222 |
| 2009/0032295 | A1 * | 2/2009 | Okajima et al. | 174/260 |
| 2009/0053402 | A1 * | 2/2009 | Sekiguchi et al. | 427/100 |
| 2009/0090928 | A1 * | 4/2009 | Mori et al. | 257/99 |
| 2009/0142026 | A1 * | 6/2009 | Shioda | 385/131 |
| 2009/0154130 | A1 * | 6/2009 | Chen et al. | 361/803 |
| 2010/0024327 | A1 * | 2/2010 | Kennedy | 52/182 |
| 2010/0243297 | A1 * | 9/2010 | Oosawa et al. | 174/251 |
| 2011/0085771 | A1 * | 4/2011 | Matsuyama et al. | 385/125 |
| 2012/0262945 | A1 * | 10/2012 | Cho et al. | 362/615 |
| 2012/0268968 | A1 * | 10/2012 | Cho et al. | 362/631 |
| 2013/0048347 | A1 * | 2/2013 | Shiu et al. | 174/254 |
| 2013/0092421 | A1 * | 4/2013 | Kajiya | 174/252 |

FOREIGN PATENT DOCUMENTS

| | | |
|---|---|---|
| KR | 10-2011-0082598 A | 7/2011 |
| KR | 10-2011-0084058 A | 7/2011 |

* cited by examiner (a)

(b)

(a)

(b)

(a)

(b)

BENT PRINTED CIRCUIT BOARD FOR BACKLIGHT UNIT

CROSS-REFERENCE TO RELATED APPLICATIONS

This application is the U.S. national stage application of International Patent Application No. PCT/KR2012/009658, filed Nov. 15, 2012, which claims priority to Korean Application No. 10-2011-0119555, filed Nov. 16, 2011, the disclosures of each of which are incorporated herein by reference in their entirety.

TECHNICAL FIELD

Embodiments of the present invention relates to a bent printed circuit board for a backlight unit.

BACKGROUND ART

As the electromagnetic instrument industry has been advanced, various display devices have been developed. Also, image apparatuses, computers, mobile communication terminals and the like in which the display devices are used trend to be developed. A liquid crystal display (LCD) device appeared by this trend is being spotlighted as a display device for a monitor and a mobile communication terminal and the like.

A liquid crystal display (LCD) device applies the electrical and optical properties of liquid crystal with an intermediate property between liquid and solid to a display device, and is a electrical device which changes and transmits various electrical information generated from various kinds of devices to visual information using a variation in transmittance of the liquid crystal depending on an approved voltage. The liquid crystal display device is a flat display device which has been widely used because power consumption is small due to a low operating voltage, and it is convenient to carry about it.

Since the LCD device has no self-luminosity which emits light itself, a backlight is always required from all LCD devices. The backlight performs the function of a light source of the LCD device, a composite composed of a power circuit for driving a light source as well as the light source itself for irradiating light to a rear surface of a liquid crystal module and all adjuncts for forming uniform flat light is called a backlight unit (BLU). A backlight unit using a light emitting diode (LED) has been recently suggested as a light source to illuminate the LCD. The LED is a light emitting device which generates light using a light emitting phenomenon generated when a voltage is applied to a semiconductor. This LED is advantageous because it is small-sized compared to a conventional light source and has a long lifespan. Also, it is advantageous that the LED has a low operating voltage with high energy efficiency because electrical energy is directly changed to light energy.

The backlight unit is used in such a manner that a plurality of light source devices such as the LED is mounted on the printed circuit board (PBC). Because the printed circuit board should endure heat emitted from the light source devices, a metal material is mainly used for it. However, if the heat emitted from the light source devices is not properly emitted, the problem that the light source devices are destroyed or the lifespan is reduced is generated.

FIG. 1 is a view illustrating cross sections of a flat printed circuit board and a bent printed circuit board.

Referring to (a) on FIG. 1, a flat printed circuit board 100 includes a metal plate 10, an insulating layer 120, a circuit pattern 130 and a solder-resist 140. The circuit pattern 130 is formed by laminating a metal layer such as a copper layer on the insulating layer 120 and patterning the metal layer. The solder-resist 140 is applied to the circuit pattern 130 to prevent a solder bridge phenomenon between circuits at the time of soldering from being generated, and thus the circuits may be protected. A light source device, namely, an LED, is mounted on the flat printed circuit board 100.

To improve a heat dissipating property, as illustrated in (b) on FIG. 1, the flat printed circuit board 100 may be bent by a bending process so that it becomes a bent printed circuit board 110. The bent printed circuit board 110 may emit a lot of heat compared to the flat printed circuit board. The reason is because the bent printed circuit board 110 may provide a wider radiation area compared to the flat printed circuit board 100 if spaces to be mounted are the same. For example, as illustrated in FIG. 2, the bent printed circuit board is mounted in a backlight unit.

FIG. 2 illustrates a cross-sectional view showing that a bracket 40 and the bend printed circuit board 110 manufactured according to a conventional art are mounted in a chassis 50 which is a light guiding passage of the backlight unit.

Referring to FIG. 1, the bent printed circuit board 110, and the bracket 40 for fixing it to the chassis 50 are separately manufactured, and are bonded to each other using a thermal interface material 20 (TIM). Also, they are mounted in the chassis 50 used as the light guiding passage using a thermal interface material 30. The LED (not drawn) is mounted on the bent printed circuit board 110. The bracket 40 in which the bent printed circuit board 110 is installed also has a similar shape to that of the bent printed circuit board 110.

Like this, the flat printed circuit board for emitting heat well from the LED has an L shape due to a bending process. However, the bent printed circuit board 110 may be varied by a spring back phenomenon.

FIG. 3 is a view for explaining a spring back phenomenon.

Referring to FIG. 3, the spring back phenomenon is called an elastic operation trying to be restored into an original shape when a plastic material is bent by a bending process and a pressure is then removed from it, and a phenomenon that an amount of bending is reduced. The flat printed circuit board 100 suffers the elastic operation trying to be restored into its original flat shape in an arrow direction as illustrated in FIG. 3.

FIG. 4 is a view showing a bent printed circuit board in which a spring back phenomenon is generated.

Referring to FIG. 4, one part of the bent printed circuit board 110 is illustrated. The illustrated part is a flat part of the bent printed circuit board 110. When the bent printed circuit board 10 formed by bending the flat printed circuit board suffers the spring back phenomenon, bowing may be generated at the bent printed circuit board 10. In this case, it was problematic that when an LED mounting part 100 is mounted on the bent printed circuit board 10, adhesion or a coupling property to the bent printed circuit board 10 is reduced due to the bowing of the bent printed circuit board 10, and an optical property of the LED is reduced.

DISCLOSURE OF INVENTION

Technical Problem

Accordingly, the present invention has been made keeping in mind the above problems occurring in the related art. An aspect of the present invention provides a bent printed circuit board for a backlight unit.

Solution to Problem

According to an aspect of the present invention, there is provided a bent printed circuit board, including: a metal plate including a first part, a second part extending from the first part, and a bending part formed between the first part and the second part; an insulating layer on the metal plate; and through holes passing through at least one of the metal plate and the insulating layer and placed on the bending part.

Advantageous Effects of Invention

According to some embodiments of the present invention, since the holes are formed in the bent part of the bent printed circuit board, the problem that the adhesion or the coupling property between the bent printed circuit board and the light source device, namely, the LED is reduced due to the bowing of the bent printed circuit board can be removed, and the problem that the optical property of the light source device is reduced due to the bowing of the bent printed circuit board can be also removed.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Figure 1:
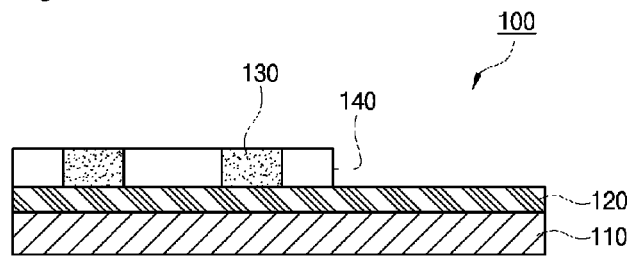
FIG. 1 is a view illustrating cross sections of a flat printed circuit board and a bent printed circuit board.
Figure 1:
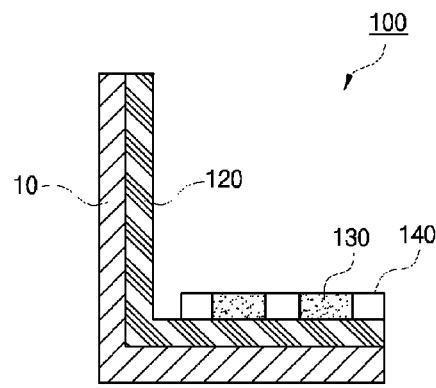
Figure 2:
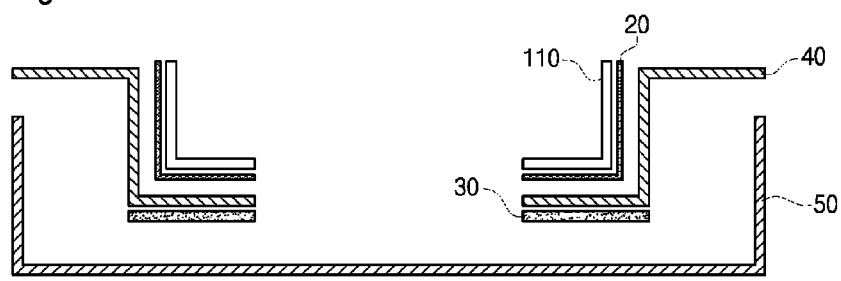
FIG. 2 illustrates a cross sectional view showing that a bent printed circuit board and a bracket are mounted in a chassis which is a light guiding passage of a backlight unit.
Figure 3:
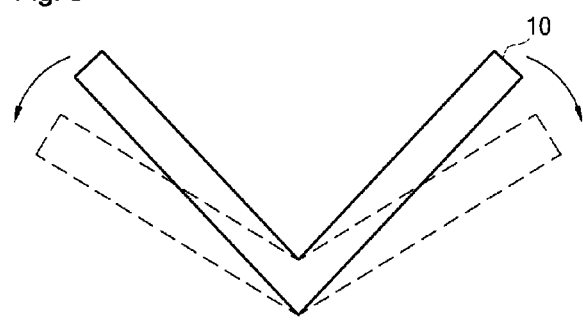
FIG. 3 is a view for explaining a spring back phenomenon.
Figure 4:
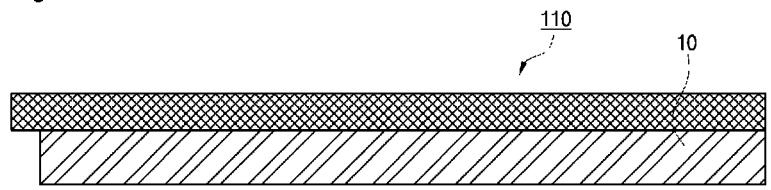
FIG. 4 is a view showing a bent printed circuit board in which the spring back phenomenon is generated.
Figure 4:
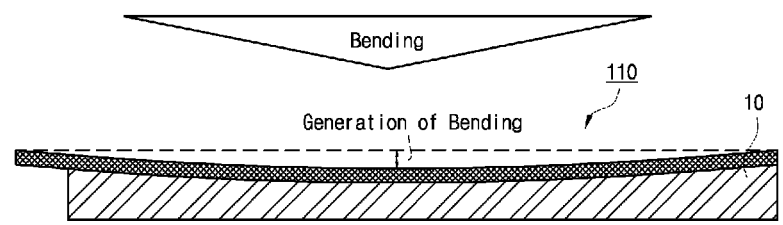

Hereinafter, preferred embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted. Furthermore, it should be understood that the shape and size of the elements shown in the drawings may be exaggeratedly drawn to provide an easily understood description of the structure of the present invention rather than reflecting the actual sizes of the corresponding elements.

Figure 5:
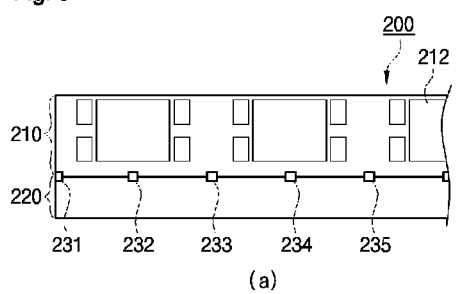
FIG. 5 is a view showing a bent printed circuit board according to one exemplary embodiment of the present invention.
Figure 5:
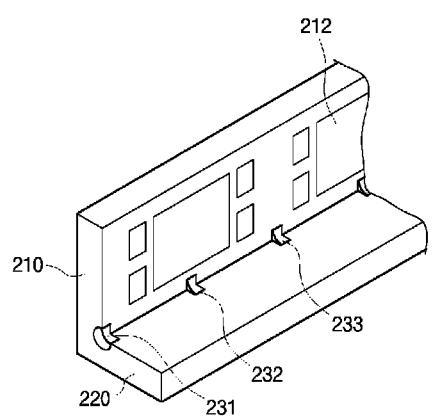

FIG. 5 is a view showing a bent printed circuit board according to one exemplary embodiment of the present invention.

Referring to FIG. 5, a bent printed circuit board 200 for a backlight unit according to one exemplary embodiment of the present invention is formed by bending a flat printed circuit board so as to have an L shape using a bending process. The bent printed circuit board 200 includes: a first part 210 including an area 212 in which a light source device, namely, LED, is mounted (212); and a second part 220 which is roughly perpendicular to the first part and is extended from the first part. That is, the second part 220 is bent and extended from the first part 210.

The bent printed circuit board includes: a metal plate, an insulating layer, a circuit pattern and a solder-resist, even though this is not illustrated. The circuit pattern is formed by laminating a metal layer such as a copper layer and the like on the insulating layer and patterning the metal layer. The solder-resist is applied to the circuit pattern to prevent a solder bridge phenomenon between circuits at the time of soldering from being generated, and thus the circuits may be protected. The light source device, namely, the LED, is mounted in the first part of the bent printed circuit board.

Wirings for an electrical connection with respect to the LED which is mounted in the first part 210 may be formed in the second part 220. When the bent printed circuit board 200 is mounted in a liquid crystal display device, the first part 210 is located to correspond to a width of the liquid crystal display device, and the second part 220 is located to correspond to a surface of the liquid crystal display device.

Furthermore, the bent printed circuit board 200 includes a plurality of holes 231, 232, 233 around a boundary surface between the first part 210 and the second part 220, namely, in a bent part of the bent printed circuit board 200. In this case, each hole may be formed in a predetermined range from a bent place of the bent printed circuit board 200. For example, the predetermined range may be ±5 mm from the boundary surface between the first part 210 and the second part 220. However, the present invention is not limited to this. Other ranges for a formation area of the holes may be determined by those having ordinary skill in the art. Also, each hole is formed throughout a first area and a second area. That is, some part of each hole is formed in the first area, and the remaining part of each is formed in the second area.

The plurality of holes 231, 232, 233 may be formed in various depths, and sizes according to various exemplary embodiments. For example, the plurality of holes 231, 232, 233 may have a depth determined depending on a thickness of the printed circuit board. Also, the plurality of holes may have different depths or sizes from each other. Alternatively, the plurality of holes may be formed to pass through the printed circuit board 200.

The plurality of holes may be formed by removing the insulating layer from a formation position of the holes of the printed circuit board 200. Alternatively, the plurality of holes may be formed by removing a part of a metal plate below the insulating layer as well as the insulating layer from the formation position of the holes of the printed circuit board 200. Also, an interval between the plurality of holes 230 may be varied depending on various exemplary embodiments. The plurality of holes 231, 232, 233 may be formed on a flat printed circuit board before being bent so that the flat printed circuit board becomes the bent printed circuit board 200. The plurality of holes 231, 232, 233 formed in the bent part of the bent printed circuit board 200 reduces an elastic force experienced by the bent printed circuit board 200 due to spring back when the flat printed circuit board is bent. In the other words, the present invention can minimize the elasticity transmitting phenomenon of a material of the bent printed circuit board 210, namely, the spring back phenomenon by forming the holes in the bent part of the bent printed circuit board 200.

That is, the plurality of holes 231, 232, 233 may be formed in the bent part of the printed circuit board 200, so an elastic force generated when the flat printed circuit board is bent is reduced by the holes formed in the bent part. Thus, the bent printed circuit board 200 can hardly suffer the spring back phenomenon generated when the bent printed circuit board 200 is bent.

Accordingly, the problem that adhesion or a coupling property between the LED and the bent printed circuit board 200 is deteriorated due to the bowing of the bent printed circuit board 200 can be removed, and thus the problem that an optical property of the LED is deteriorated due to the bowing of the bent printed circuit board 200 can be also removed.

Figure 6:
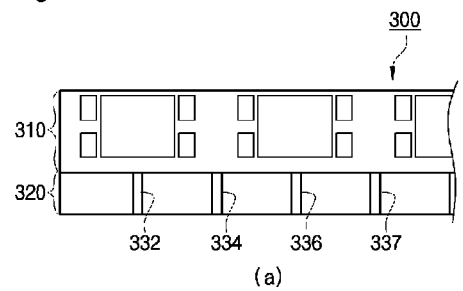
FIG. 6 is a view showing a bent printed circuit board according to another exemplary embodiment of the present invention.
Figure 6:
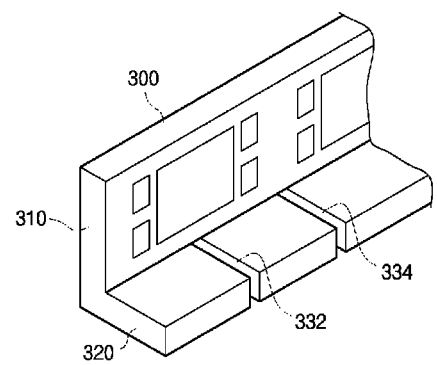

FIG. 6 is a view showing the printed circuit board according to another exemplary embodiment of the present invention.

Referring to FIG. 6, to be similar to one exemplary embodiment, a bent printed circuit board 300 according to another exemplary embodiment of the present invention is formed by bending a flat printed circuit board using a bending process so as to have an L shape. The bent printed circuit board 300 includes a first part 310 including an area in which an LED is mounted, and a second part 320 roughly perpendicular to the first part 310. A plurality of grooves 332, 334 is formed in the second part at predetermined intervals.

As illustrated in FIG. 6, the plurality of grooves 332, 334 may be formed in latitudinal direction of the second part 320, namely, a width direction of the second part 320 at predetermined intervals. Also, the plurality of grooves 332, 334 may be formed to pass through the bent printed circuit board 300. However, the present invention is not limited to this. For example, the plurality of grooves 332, 334 may not pass through the bent printed circuit board 300. For example, the plurality of holes according to one exemplary embodiment may extend to the second part so that the plurality of grooves 332, 334 may be formed. The plurality of grooves 332, 334 may reduce an elastic force experienced by the bent printed circuit board 300 due to spring back when the flat printed circuit board is bent.

Figure 7:
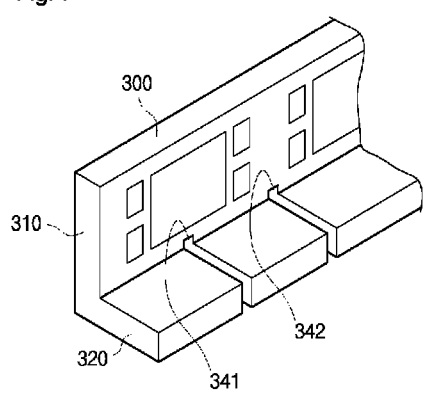
FIG. 7 and FIG. 8 are views showing a bent printed circuit board according to still another exemplary embodiment of the present invention.
Figure 8:
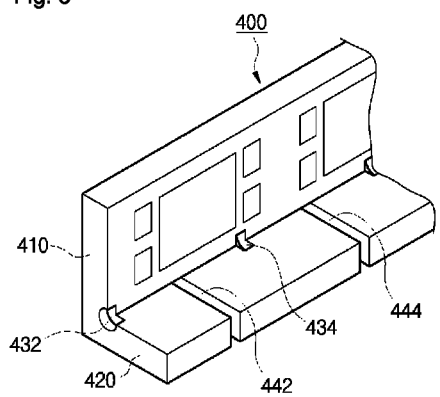
Figure 9:
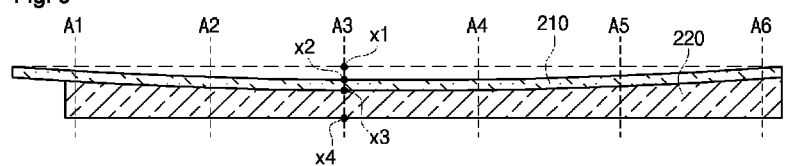
FIG. 9 is a view showing a standard for measuring the bowing of elements for a backlight unit according to various exemplary embodiments of the present invention.

FIG. 7 and FIG. 8 are views showing the printed circuit boards according to still another exemplary embodiment of the present invention.

The bent printed circuit board 300 as illustrated in FIG. 7 includes the plurality of holes 341, 342 in the second part 320. The plurality of holes 341, 342 may extend to a part of the first part 310 to be different from the bent printed circuit board according to still another exemplary embodiment of the present invention. That is, the plurality of holes 341, 342 may be also formed in a part of the first part.

A bent printed circuit board 400 as illustrated in FIG. 8 includes holes 432, 434 which are similar to one exemplary embodiment of the present invention, and grooves 442, 444 which are similar to another exemplary embodiment of the present invention. As illustrated in FIG. 8, the holes 432, 434 and the grooves 442, 444 may be reciprocally located. Table 1 below explains a relationship between the interval and length of the holes, and the bowing of the bent printed circuit board in the elements for the backlight unit according to the present invention.

TABLE 1

| Division | Interval of Holes | Length of Hole | Thickness of PCB | Width of PCB after being bent | Bowing of PCB after being bent |
|---|---|---|---|---|---|
| | | | | Results after being bent | |
| Case 1 | Existing Standard | 10.0 (Existing Width) | 0.6 t | Max 11.08, cpk –0.53 | Max 1.39 |
| Case 2 | Per 1 LED | 3.0 (Existing Width) | 0.6 t | Max 10.47, cpk –0.72 | Max 0.57 |

TABLE 1-continued

| Division | Interval of Holes | Length of Hole | Thickness of PCB | Width of PCB after being bent | Bowing of PCB after being bent |
|---|---|---|---|---|---|
| | | | | Results after being bent | |
| Case 3 | Per 3 LEDs | 3.0 (Existing Width) | 0.6 t | Max 10.38, cpk –0.45 | Max 0.97 |
| Case 4 | Per 5 LEDs | 3.0 (Existing Width) | 0.6 t | Max 10.34, cpk –0.29 | Max 1.19 |
| Case 5 | Existing Standard | 10.0 (Existing Width) | 1.0 t | Max 10.58, cpk –0.22 | Max 1.45 |
| Case 6 | Per 1 LED | 3.0 (Existing Width) | 1.0 t | Max 10.16, cpk 0.9 | Max 0.64 |
| Case 7 | Per 3 LEDs | 3.0 (Existing Width) | 1.0 t | Max 10.2, cpk 0.72 | Max 1.34 |
| Case 8 | Per 5 LEDs | 3.0 (Existing Width) | 1.0 t | Max 10.97, cpk 0.12 | Max 1.47 |
| Case 9 | Per 3 LEDs | 2.0 (Existing Width) | 1.0 t | Max 10.47, cpk 0.13 | Max 1.71 |
| Case 10 | Per 3 LEDs | 5.0 (Existing Width) | 1.0 t | Max 10.22, cpk 0.31 | Max 1.18 |

A1 through A6 on FIG. 8 represent a measured place, X1 and X2 represent the bowing of the PCB, and X3 and X4 represent a width of the PCB. Of course, after the flat printed circuit board is bent, the case that the printed circuit board has the smallest bowing may be a most desirable case. Also, the CPK is an indicator showing the process capability of tolerance and the bigger the better.

The present invention may form the holes by varying intervals and lengths of the holes according to various exemplary embodiments according to the bent printed circuit board. Referring to Table 1, the width and bowing of the bent printed circuit board are differently measured depending on the interval and length of the holes formed in the bent part of the bent printed circuit board. The case that the printed circuit board has the smallest bowing after the flat printed circuit board may be the most desirable case. Furthermore, the CPK is an indicator showing the process capability of tolerance and the bigger the better.

As shown in Table 1, the more the holes in the bent part of the bent printed circuit board are, the more the deformation of the width of the bent printed circuit board and the bowing of the bent printed circuit board are reduced. Also, in the case where the holes are formed in the bent part of the bent printed circuit board at similar intervals, the larger a length of the holes is, the more the more the deformation of the width of the bent printed circuit board and the bending of the bent printed circuit board are reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A bent printed circuit board, comprising:
a metal plate including a first part, a second part extending from the first part, and a bending part formed between the first part and the second part;
an insulating layer on the metal plate; and
grooves on the second part that extend from an edge of the bending part and away from the bending part, and pass through at least one of the metal plate and the insulating layer.

2. The bent printed circuit board of claim 1, wherein the grooves pass through both the metal plate and the insulating layer.

3. The bent printed circuit board of claim 2, wherein the grooves extend through the bending part and partially into the first part.

4. The bent printed circuit board of claim 1, wherein the grooves extend through the bending part and partially into the first part.

5. The bent printed circuit board of claim 4, wherein the grooves pass through both the metal plate and the insulating layer.

6. The bent printed circuit board of claim 1, further comprising holes in the bending part, wherein the holes are formed in alternating fashion with the grooves along a length of the bending part.

7. A bent printed circuit board, comprising:
a metal plate including a first part, a second part extending from the first part, and a bending part formed between the first part and the second part;
an insulating layer on the metal plate;
through holes passing through at least one of the metal plate and the insulating layer and placed on the bending part; and
grooves formed in the second part,
wherein the grooves pass through at least one of the metal plate and the insulating layer and are placed on the bending part.

8. The bent printed circuit board of claim 7, wherein the grooves are connected to the through holes.

9. The bent printed circuit board of claim 7, wherein the grooves are formed at one end side of the second part from the bending part.

10. The bent printed circuit board of claim 9, wherein the grooves are formed at the closest one end side of the second part from the bending part.

11. The bent printed circuit board of claim 7, wherein the grooves are formed by crossing the second part.

* * * * *